US009602120B1

(12) United States Patent
Plouchart et al.

(10) Patent No.: US 9,602,120 B1
(45) Date of Patent: Mar. 21, 2017

(54) ANALOG TO DIGITAL CONVERTER WITH DIGITAL REFERENCE VOLTAGE SIGNAL (71) Applicant: International Business Machines Corporation, Armonk, NY (US)

(72) Inventors: Jean-Olivier Plouchart, New York, NY (US); Vanessa H-C Chen, San Diego, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/089,912

(22) Filed: Apr. 4, 2016

(51) Int. Cl.
H03M 1/00 (2006.01)
H03M 1/10 (2006.01)
H03M 1/12 (2006.01)
H03M 1/08 (2006.01)

(52) U.S. Cl.
CPC ....... H03M 1/1009 (2013.01); H03M 1/0809 (2013.01); H03M 1/124 (2013.01)

(58) Field of Classification Search
CPC ...... H03M 1/365; H03M 1/12; H03M 1/1061; H03M 1/36; H03M 1/361; H03M 1/468; H03M 1/1038; H03M 1/182; H03M 1/167; H03M 1/181; H03M 1/00; H03M 1/10; H03M 1/1057; H03M 3/458; H03M 7/165
USPC .......... 341/118, 120, 155, 158, 159
See application file for complete search history.

(56) References Cited

U.S. PATENT DOCUMENTS

| 4,939,518 A * | 7/1990 | Hotta | H03M 1/206 341/155 |
|---|---|---|---|
| 6,583,747 B1 | 6/2003 | van der Goes et al. | |
| 6,590,518 B1 | 7/2003 | Taft | |
| 7,265,705 B1 | 9/2007 | Lee et al. | |
| 8,049,652 B2 | 11/2011 | Oo | |
| 8,362,939 B2 | 1/2013 | Buter et al. | |
| 2008/0246646 A1 | 10/2008 | Anthony et al. | |

(Continued)

FOREIGN PATENT DOCUMENTS

| CN | 101917195 A | 12/2010 |
|---|---|---|
| EP | 9801436 A2 | 2/2000 |
| WO | 2009074971 A1 | 6/2009 |

OTHER PUBLICATIONS

Arias, J., et al; "Low-power pipeline ADC for wireless LANs." Solid-State Circuits, IEEE Journal of 39, No. 8 (2004): 1338-1340.

(Continued)

Primary Examiner — Linh Nguyen
(74) Attorney, Agent, or Firm — Patent Portfolio Builders PLLC (57) ABSTRACT An analog to digital converter contain a plurality of comparators, each having a plurality of positive input voltage transistors and a plurality of negative input voltage transistors. Each positive input transistor is in communication with a positive input voltage, and each negative input transistor is in communication with a negative input voltage. Each comparator is configured to adjust a positive reference voltage and a negative reference voltage used to generate a binary comparator output for each comparator indicating a result of a comparison between a voltage differential defined by the positive input voltage and the negative input voltage and a unique voltage range indicated by a unique digital reference signal communicated to each comparator.

20 Claims, 4 Drawing Sheets (56) References Cited

U.S. PATENT DOCUMENTS

| | | | |
|---|---|---|---|
| 2008/0303592 A1* | 12/2008 | Deguchi et al. | H03F 3/45183 330/254 |
| 2009/0179787 A1* | 7/2009 | Naka et al. | H03K 5/2481 341/155 |
| 2009/0195424 A1* | 8/2009 | Van Der Plas et al. | H03M 1/1061 341/120 |
| 2009/0243907 A1 | 10/2009 | Nazemi et al. | |
| 2010/0103010 A1 | 4/2010 | Zhuang | |
| 2011/0043395 A1 | 2/2011 | Sun et al. | |
| 2011/0210879 A1* | 9/2011 | Barrow et al. | H01L 27/0207 341/136 |
| 2011/0241912 A1* | 10/2011 | Doris | H03M 1/0614 341/110 |
| 2011/0298641 A1* | 12/2011 | Khanpour | H03M 1/0809 341/118 |
| 2012/0176259 A1* | 7/2012 | Sanduleanu et al. | H03M 1/1061 341/118 |
| 2012/0212356 A1* | 8/2012 | Killat et al. | H03M 1/125 341/110 |
| 2013/0038483 A1 | 2/2013 | Liu et al. | |
| 2013/0176156 A1* | 7/2013 | Danjo | H03K 5/249 341/155 |
| 2014/0022430 A1* | 1/2014 | Ueno et al. | H04N 5/37455 348/308 |

OTHER PUBLICATIONS

Le, Hai Phuong, et al; "A 12-bit high performance low cost pipeline ADC." In Electronics, Circuits and Systems, 2003. ICECS 2003. Proceedings of the 2003 10th IEEE International Conference on, vol. 2, pp. 471-474. IEEE, 2003.

Ohhata, Kenichi, et al; "A 1-GHz, 7-mW, 8-Bit Subranging ADC without Resistor Ladder Using Built-In Threshold Calibration"; Circuits and Systems, 2014, vol. 5, pp. 76-88.

Paik, Daehwa, et al; "An Analysis of a Pseudo-Differential Dynamic Comparator with Load Capacitance Calibration", Department of Physical Electronics, ASIC (ASICON), 2011 IEEE 9th International Conference; Oct. 25-28, 2011, pp. 461-464.

V. H.-C. Chen et al., "An 8.5mW 5GS/s 6b Flash ADC with Dynamic Offset Calibration in 32nm CMOS SOI", IEEE Symposium on VLSI Circuits Digest of Technical Papers, Jun. 2013.

J.-O. Plouchart et al., "A 3.2GS/s 45513 ENOB Two-Step Subranging ADC in 45nm SOI CMOS", IEEE, CICC, 2012, pp. 1-4.

Y.-S. Shu, "A 6b 3GS/s 11mW Fully Dynamic Flash ADC in 40nm CMOS with Reduced Number of Comparators", IEEE Symposium on VLSI Circuits Digest of Technical Papers, Jun. 2012, pp. 26-27.

* cited by examiner

ANALOG TO DIGITAL CONVERTER WITH DIGITAL REFERENCE VOLTAGE SIGNAL

STATEMENT REGARDING FEDERALLY SPONSORED RESEARCH OR DEVELOPMENT

This invention was made with Government support under Contract No.: FA8650-09-C-7924 awarded by the Defense Advanced Research Projects Agency (DARPA). The Government has certain rights in this invention.

FIELD OF THE INVENTION

The present invention relates to analog to digital converters.

BACKGROUND OF THE INVENTION

Analog to digital converters (ADC) convert a continuous analog signal, for example, a continuous analog voltage, to a digital equivalent that represents the magnitude or amplitude of the analog voltage. In general, the ADC samples the analog signal at discrete time periods and converts each sample into a corresponding digital value. The resulting sampling rate affects the type of circuit used for the ADC. Conventional ADC circuit arrangements, in order of increasing sampling rate, include successive approximation (SAR) ADC, pipeline ADC and flash ADC. Since the SAR ADC uses only one comparator, this ADC has low power consumption. However, for an n-bit SAR ADC, n clock cycles are required. Therefore, the SAR ADC suffers from low speed. At the other end of the sampling rate is flash ADC. While flash ADC provides high speed, it requires a large number of comparators equal to $2^n - 1$ where n is the ADC bit resolution. The result is a large area and high power consumption.

A conventional pipeline ADC utilizes a smaller number of comparators than flash ADC and has a higher throughput than SAR ADC as a result of the pipelining architecture. However, pipeline ADC suffers from a speed limitation due to the need for a high-gain/linearity amplifier that is used to amplify the residue. One proposed modification to these conventional ADCs is a sub-ranging ADC. The sub-ranging ADC also has a smaller number of comparators than a flash ADC and provides a higher speed than the pipeline ADC. The sub-ranging provides for two separate conversions, a coarse conversion and a fine conversion. This architecture, however, imposes a speed limitation, as these two separate conversions need to be accomplished, i.e., there is no pipelining. In order to achieve the same output, the sub-ranging ADC is clocked at twice the speed.

SUMMARY OF THE INVENTION

Systems and methods in accordance with the present invention are directed to an analog to digital converter and to a method of using the analog to digital converter. The analog to digital converter includes a plurality of comparators grouped into two stages. Each stage includes a unique set of comparators selecting from the plurality of comparators. These stages include a first stage and a secondary stage. Each comparator in the first stage is a static comparator in communication with a set unique digital reference signal. Each static comparator generates a binary comparator output based on a comparison between the set unique digital reference signal and a voltage differential defined by a positive input voltage and a negative input voltage to generate a plurality of binary comparator outputs associated with the first stage. Differential voltages are typically used because differential circuit architecture can reject common mode differential noise. Single-ended circuit architecture can also be used, however signal to noise ratio will be degraded. Each comparator in each secondary stage is a dynamic comparator in communication with a dynamic unique digital reference signal based on the plurality of binary comparator outputs from the first stage to generate the binary comparator output based on a comparison between the dynamic unique digital reference signal and the voltage differential.

In one embodiment, the plurality of binary comparator outputs from the first stage form thermometer code. The analog to digital converter further includes a thermometer to binary converter in communication with the plurality of binary comparator outputs to convert the thermometer code for the first stage to a corresponding digital stage output. The dynamic unique reference signal in each dynamic comparator in the second stage is set based on the digital stage output from the first stage.

In one embodiment, the analog to digital converter includes a plurality of stages arranged in a series. Each stage contains a unique set of comparators selected from the plurality of comparators, and these selected comparators generate a plurality of binary comparator outputs for that stage. The plurality of stages includes the first stage, the second stage and a plurality of additional secondary stages. Each comparator in each secondary stage is the dynamic comparator in communication with the dynamic unique digital reference signal based on the plurality of binary comparator outputs from a preceding stage in the series. In one embodiment, the plurality of binary comparator outputs from each stage comprise thermometer code, and the analog to digital converter includes a thermometer to binary converter in communication with all binary comparator outputs to convert the thermometer code for each stage to a corresponding digital stage output. The dynamic unique reference signal in each dynamic comparator in each secondary stage is set based on the digital stage output from the preceding stage.

In one embodiment, the analog to digital converter includes a multiplexer in communication with each one of the plurality of comparators. The multiplexer is configured to communicate a given positive input voltage and negative input voltage in parallel to all comparators in a given stage and in series to each stage in the plurality of stages. In one embodiment, a digital voltage output of the analog to digital converter is a combination of the digital stage output from all stages. In one embodiment, each comparator further includes a plurality of positive reference voltage selectors and a plurality of negative reference voltage selectors. Each positive reference voltage selector is in communication with one of a plurality of positive input voltage transistors and an inverse of a given unique digital reference signal to adjust a positive reference voltage by selecting a subset of the plurality of positive input voltage transistors in response to the inverse of the given unique digital reference signal. Each negative reference voltage selector is in communication with one of a plurality of negative input voltage transistors and the given unique digital reference signal to adjust a negative reference voltage by selecting a subset of the plurality of negative input voltage transistors in response to the given unique digital reference signal. The positive reference voltage and negative reference voltage are used to generate the binary comparator output for each comparator.

Exemplary embodiments are directed to an analog to digital converter containing a plurality of comparators. Each comparator contains a plurality of positive input voltage transistors, where each positive input transistor in communication with a positive input voltage, and a plurality of negative input voltage transistors in a differential pair configuration with the plurality of positive input voltage transistors, where each negative input transistor in communication with a negative input voltage. Each comparator is configured to adjust a positive reference voltage and a negative reference voltage used to generate a binary comparator output for each comparator indicating a result of a comparison between a voltage differential defined by the positive input voltage and the negative input voltage and a unique voltage range indicated by a unique digital reference signal communicated to each comparator. In one embodiment, the positive input voltage is in communication with a positive input transistor gate of each positive input transistor, and the negative input voltage is in communication with a negative input transistor gate of each negative input transistor.

In one embodiment, each comparator also includes a plurality of positive reference voltage selectors and a plurality of negative reference voltage selectors. Each positive reference voltage selector is in communication with one of the positive input voltage transistors and an inverse of the unique digital reference signal to adjust the positive reference voltage by selecting a subset of the plurality of positive input voltage transistors in response to the inverse of the unique digital reference signal. Each negative reference voltage selector is in communication with one of the negative input voltage transistors and the unique digital reference signal to adjust the negative reference voltage by selecting a subset of the plurality of negative input voltage transistors in response to the unique digital reference signal. In one embodiment, calibration circuitry is provided that adjusts the positive reference voltage and the negative reference voltage in response to a digital offset signal to compensate for differences in threshold values among the plurality of positive input voltage transistors and the plurality of negative input voltage transistors.

In one embodiment, the analog to digital converter includes at least two stages arranged in a series. Each stage includes a unique set of comparators from the plurality of comparators that generate a plurality of binary comparator outputs associated with that stage. The at least two stages include a first stage and at least one secondary stage. Each comparator in the first stage is a static comparator in communication with a set unique digital reference signal, and each comparator in each secondary stage is a dynamic comparator in communication with a dynamic unique digital reference signal based on the plurality of binary comparator outputs from a preceding stage in the series. In one embodiment, the plurality of binary comparator outputs from stage constitute thermometer code, and the analog to digital converter includes a thermometer to binary converter in communication with each stage to convert the thermometer code for each stage to a corresponding digital stage output. The dynamic unique reference signal in each dynamic comparator in each secondary stage is set based on the digital stage output from the preceding stage in the series. In one embodiment, the thermometer to binary converter includes bubble correction. In one embodiment, a digital voltage output of the analog to digital converter is a combination of the digital stage output from all stages. In one embodiment, a multiplexer is provided in communication with each one of the plurality of comparators. The multiplexer is configured to communicate a given positive input voltage and negative input voltage in parallel to all comparators in a given stage and in series to each stage in the at least two stages. In one embodiment, a plurality of track and hold circuits is provided in communication with the multiplexer. Each track and hold circuit is configured to communicate a separate positive input voltage and negative input voltage to the multiplexer.

Exemplary embodiments are directed to an analog to digital converter containing a plurality of comparators grouped into two stages, a first stage and a secondary stage. Each stage includes a unique set of comparators selected from the plurality of comparators. Each comparator in the first stage is a static comparator in communication with a set unique digital reference signal and generating a binary comparator output based on a comparison between the set unique digital reference signal and a voltage differential defined by a positive input voltage and a negative input voltage to generate a plurality of binary comparator outputs associated with the first stage. Each comparator in each secondary stage is a dynamic comparator in communication with a dynamic unique digital reference signal based on the plurality of binary comparator outputs from the first stage to generate the binary comparator output based on a comparison between the dynamic unique digital reference signal and the voltage differential.

In one embodiment, the plurality of binary comparator outputs from the first stage constitute thermometer code, and the analog to digital converter includes a thermometer to binary converter in communication with the plurality of binary comparator outputs to convert the thermometer code for the first stage to a corresponding digital stage output. The dynamic unique reference signal in each dynamic comparator in the second stage is set based on the digital stage output from the first stage. In one embodiment, the analog to digital converter includes a plurality of stages arranged in a series. Each stage includes a unique set of comparators selected from the plurality of comparators that generate a plurality of binary comparator outputs for that stage. The plurality of stages includes the first stage, the second stage and a plurality of additional secondary stages. Each comparator in each secondary stage is the dynamic comparator in communication with the dynamic unique digital reference signal based on the plurality of binary comparator outputs from a preceding stage in the series.

In one embodiment, the plurality of binary comparator outputs from each stage constitute thermometer code, and the analog to digital converter includes a thermometer to binary converter in communication with all binary comparator outputs to convert the thermometer code for each stage to a corresponding digital stage output. The dynamic unique reference signal in each dynamic comparator in each secondary stage is set based on the digital stage output from the preceding stage. In one embodiment, a multiplexer is provided in communication with each one of the plurality of comparators. The multiplexer is configured to communicate a given positive input voltage and negative input voltage in parallel to all comparators in a given stage and in series to each stage in the plurality of stages. In one embodiment, a digital voltage output of the analog to digital converter is a combination of the digital stage output from all stages. In one embodiment, each comparator includes a plurality of positive reference voltage selectors and a plurality of negative reference voltage selectors. Each positive reference voltage selector is in communication with one of a plurality of positive input voltage transistors and an inverse of a given unique digital reference signal to adjust a positive reference voltage by selecting a subset of the plurality of positive input voltage transistors in response to the inverse of the given unique digital reference signal, and each negative reference voltage selector is in communication with one of a plurality of negative input voltage transistors and the given unique digital reference signal to adjust a negative reference voltage by selecting a subset of the plurality of negative input voltage transistors in response to the given unique digital reference signal. The positive reference voltage and negative reference voltage are used to generate the binary comparator output for each comparator.

Exemplary embodiments are also directed to a method for converting an analog voltage to a digital voltage by communicating a positive input voltage to each one of a plurality of positive input voltage transistors in each one of a plurality of comparators, communicating a negative input voltage to each one of a plurality of negative input voltage transistors in each one of the plurality of comparators, communicating a unique digital reference signal to each one of the plurality of comparators, using the plurality of positive input voltage transistors, the plurality of negative input voltage transistors and the unique digital reference signal to generate a positive reference voltage and a negative reference voltage in each one of the plurality of comparators and using the positive reference voltage and the negative reference voltage to generate a binary comparator output for each one of the plurality of comparators to indicate a result of a comparison between a voltage differential defined by the positive input voltage and the negative input voltage and a unique voltage range indicated by the unique digital reference signal communicated to each comparator.

In one embodiment, communicating the unique digital reference signal to each one of the plurality of comparators includes communicating an inverse of the unique digital reference to each one of a plurality of positive reference voltage selectors in each comparator, wherein each positive reference voltage selector in communication with one of the positive input voltage transistors in each comparator, and communicating the unique digital reference signal to each one of a plurality of negative reference voltage selectors in each comparator, where each negative reference voltage selector in communication with one of the negative input voltage transistors in each comparator. The inverse of the unique digital reference signal is used to adjust the positive reference voltage in each comparator by selecting a subset of the plurality of positive input voltage transistors in each comparator, and the unique digital reference signal is used to adjust the negative reference voltage in each comparator by selecting a subset of the plurality of negative input voltage transistors in each comparator.

In one embodiment, the plurality of comparators is grouped into at least two stages arranged in series. Each stage contains a unique set of comparators from the plurality of comparators and the at least two stages include a first stage and at least one secondary stage. Each comparator in the first stage is a static comparator in communication with a set unique digital reference signal, and each comparator in each secondary stage is a dynamic comparator in communication with a dynamic unique digital reference signal. The unique set of comparators in each stage is used to generate a plurality of binary comparator outputs, and the dynamic unique digital reference signal in each secondary stage is set based on the plurality of binary comparator outputs from a preceding stage.

DETAILED DESCRIPTION

Figure 1:
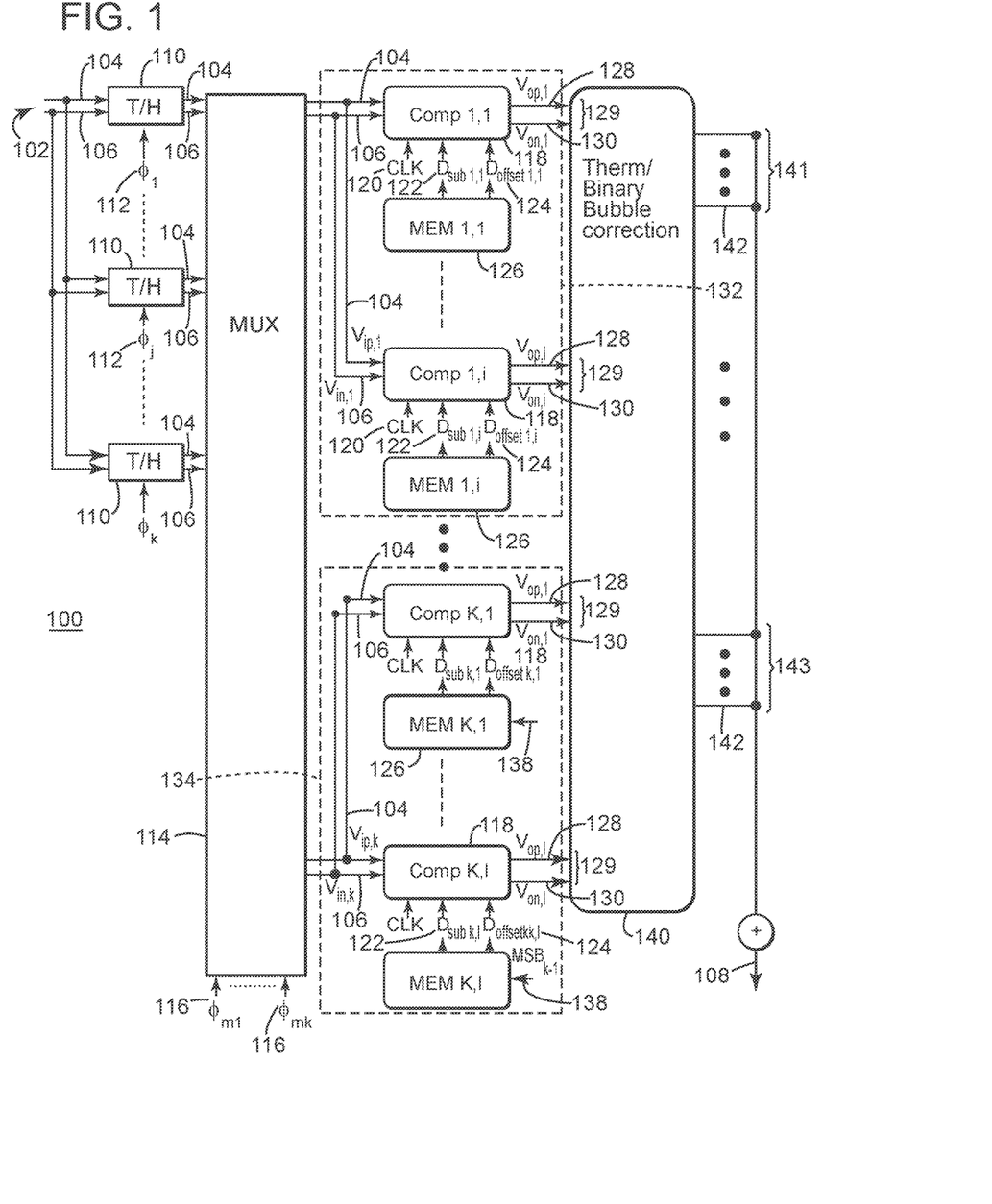
FIG. 1 is a schematic representation illustrating an embodiment of an analog to digital converter in accordance with the present invention.

The one or more embodiments describe, among other things, an ADC that can provide a desired sampling rate and throughput while minimizing size and power consumption. Referring initially to FIG. 1, exemplary embodiments in accordance with the present invention are directed to an analog to digital converter 100. The analog to digital converter converts an analog input voltage 102 to a digital output voltage 108. The analog input voltage is provided as a differential analog input having a positive input voltage 104 and a negative input voltage 106. The difference between the positive input voltage and the negative input voltage is a voltage differential, and this voltage differential is converted to the digital output voltage 108.

The analog to digital converter includes a plurality of track and hold circuits 110. Any suitable track and hold or sample and hold circuit known and available in the art can be used. Each track and circuit is in communication with the analog input voltage and samples and holds the positive input voltage and the negative input voltage at a sampling time indicated by a sampling phase signal 112 that is in communication with each one of the track and hold circuits. The sampling phase signal is applied in sequence to the plurality of track and hold circuits to sample the analog input voltage at a plurality of separate, discrete, sequential periods of time. The analog input voltage is sampled and stored in sampling capacitors within each track and hold circuit.

A multiplexer 114 is provided in communication with each one of the plurality of track and hold circuits. In particular, the multiplexer receives the sampled positive input voltage and negative input voltage that is held by each one of the track and hold circuits. Each track and hold circuit communicates a separate pair of positive input and negative input voltages to the multiplexer that were sampled at a given time. The multiplexer distributes the pairs of positive input voltages and negative input voltages through the analog to digital converter in accordance with distributing phase signals 116 that are communicated to the multiplexer.

The analog to digital converter includes a plurality of comparators 118. Each comparator is in communication with the multiplexer 114. The comparator receives a given positive input voltage and negative input voltage pair from a track and hold circuit that is routed to the comparator by the multiplexer in accordance with the distributing phase signals. The multiplexer communicates different positive input voltage and negative input voltage pairs in parallel to all comparators in the plurality of comparators. In one embodiment, a unique positive input voltage and negative input voltage pair is communicated to each comparator at any given time. The difference between the given positive input voltage and negative input voltage pair defines the voltage differential that is to converted from analog to digital. In response to a clock signal 120 sent to each comparator, each comparator generates a binary comparator output 129 that represents a comparison between the voltage differential communicated to each comparator and a reference voltage range associated with or assigned to each comparator. The binary comparator output 129 from each comparator is provided as two complementary outputs, a positive binary comparator output 128 and a negative binary comparator output 130.

The positive binary comparator output and the negative binary comparator output pair from each comparator is interpreted as defining each binary comparator output as either a logical "1" or a logical "0". For example, a logical 0 indicates that the voltage differential is not within the reference voltage range associated with that comparator, and a logical 1 indicates that the voltage differential is within the range associated with that comparator. When the outputs from multiple comparators are combined, the result is a plurality of binary comparator outputs. The plurality of binary comparator outputs for a plurality of comparators is in the form of thermometer code, i.e., a string of 0's and 1's, e.g., 00001111. As each comparator is associated with a different reference voltage range, the point at which the thermometer code switches from 0 to 1 indicates the voltage ranges at which the voltage differential goes from being outside the range to within the range.

The analog to digital comparator includes at least one memory 126 in communication with each comparator. In one embodiment, a separate memory is provided for each comparator. Alternatively, a single memory is provided in communication with all of the comparators. In addition, a separate memory can be provided for given groupings of comparators. The memory stores digital reference signals 122 that can be communicated to each comparator. A unique digital reference signal is communicated to each comparator and establishes the reference voltage associated with the comparator for purposes of comparison to the voltage differential communicated to the comparator. Also stored within the memory are digital offset signals 124 that are communicated to each comparator. These digital offset signals are used by calibration circuitry (not shown) within the comparators to compensate for differences in threshold values among electronic components within the comparators.

The analog to digital converter includes at least one thermometer to binary converter 140 that is in communication with each one of the plurality of comparators to receive the binary comparator output 129 from each comparator including both the positive binary comparator output 128 and the negative binary comparator output 130. Therefore, the thermometer to binary converter code receives the thermometer code from the comparators and converts the thermometer code to a corresponding digital output 142. The digital voltage output 108 of the analog to digital converter 100 is a combination of the digital output from all comparators. In one embodiment, the thermometer to binary converter includes bubble correction. Therefore, bubbles errors in the thermometer code, e.g., "000101111" where the sequence "10" represents the bubble error, are corrected.

The comparators are grouped into a plurality of stages 126. Each stage contains a unique set of comparators selected from the plurality of comparators. In one embodiment, the analog to digital converter includes two stages, a first stage and a second stage. Alternatively, the analog to digital converter includes the first stage and at least one or a plurality of secondary stages. The plurality of secondary stages includes the second stage and a plurality of additional secondary stages. The stages are arranged in series such that any given voltage differential is communicated to the stages in series starting with the first stage. However, the multiplexer can address the stages in parallel, sending different voltage differentials in parallel to each one of the plurality of stages. Each subsequent stage represents a finer determination of the voltage range to which each given voltage differential is compared. For example, once a given range for the given voltage differential is determined from the first stage in the series, each comparator in the second stage is used to compare the given voltage differential with a sub-range of the given range. This process is repeated for a plurality of stages, with increasingly smaller ranges assigned to each comparator. This increases the specificity of the voltage range associated with the given voltage differential.

Therefore, the thresholds of the comparators in the second stage, or any secondary stage, are determined or set based on the output, i.e., the binary comparator output, from the preceding stage in the series. In this arrangement, each stage produces a binary comparator output in the form of thermometer code. The thermometer code from each stage is communicated to the thermometer to binary converter, and the thermometer to binary converter converts the thermometer code from each stage to a corresponding digital stage output. The resulting plurality of digital stage outputs are combined into the digital voltage output of the analog to digital converter. Each digital stage output is associated with a different voltage range, and these different voltage ranges become increasingly narrow from the first stage through the secondary stages.

As illustrated in FIG. 1, the analog to digital converter includes at least two stages arranged in a series, a first stage 132 and at least one secondary stage 134. Each stage includes a unique set of comparators selected from the plurality of comparators, and each stage generates a plurality of binary comparator outputs 129 associated with that stage. Each given input voltage differential is initially sent to the first stage. The first stage, therefore, is used to make a first or coarse determination of the voltage range associated each given input voltage differential. In one embodiment, the reference ranges associated with each comparator in the first stage do not change. Therefore, each comparator in the first stage is a static comparator with a set or constant reference voltage. As the reference voltage in each comparator is established based on a unique digital reference signal stored in memory and the comparators in the first stage are static comparators, each comparator in the first stage is in communication with a set, i.e., constant or non-varying, unique digital reference signal. The thermometer code output from the comparators in this first stage is communicated to the thermometer to binary converter, which produces a digital stage output for the first stage 141. In one embodiment, this digital stage output for the first stage is referred to as the most significant bit (MSB).

Following the first stage, each given input voltage differential is sent to the at least one secondary stage. In a two stage comparator, the secondary stage is the second stage. The secondary stage, therefore, is used to make a second or subsequent determination of the voltage range associated each given input voltage differential. In one embodiment, the second determination is the fine determination. In one embodiment, the reference ranges associated with each comparator in each secondary stage change based on the plurality of binary comparator outputs from a preceding stage in the series, e.g., the first stage. Therefore, each comparator in each secondary stage is a dynamic comparator with a dynamic or changing reference voltage. As the reference voltage in each comparator is established based on a unique digital reference signal stored in memory, the unique digital reference signal is selected based on the output from the previous stage in the series and the comparators in the secondary stages are dynamic comparators, each comparator in the secondary first stage is in communication with a dynamic unique digital reference signal. In addition, the memory from which the dynamic unique reference signal is selected and communicated to the comparator is in communication with the binary comparator outputs 138 from the previous stage. When the previous stage is the first stage and the binary comparator outputs have been converted to the digital stage outputs or MSB, the MSB from the previous stage are communicated to the memory. The thermometer code output from the comparators in the secondary stage is communicated to the thermometer to binary converter, which produces a digital stage output for the secondary stage 143. In one embodiment, this digital stage output for the secondary stage is referred to as the least significant bit (LSB). The LSB would then be communicated to the memory for use in selecting the dynamic unique digital reference signals that set the thresholds for the comparators in the next stage.

The multiplexer is configured to communicate a given input voltage differential including a given positive input voltage and negative input voltage in parallel to all comparators in a given stage. In addition, the given voltage differential is communicated in series to each stage in the plurality of stages, i.e., the first stage, followed by the second stage and then sequentially through any additional secondary stages. Therefore, the multiplexer facilitates a pipelined architecture in the analog to digital converter, and each stage in the plurality of stages at any given distributing phase signal is receiving an input voltage differential.

Figure 2:
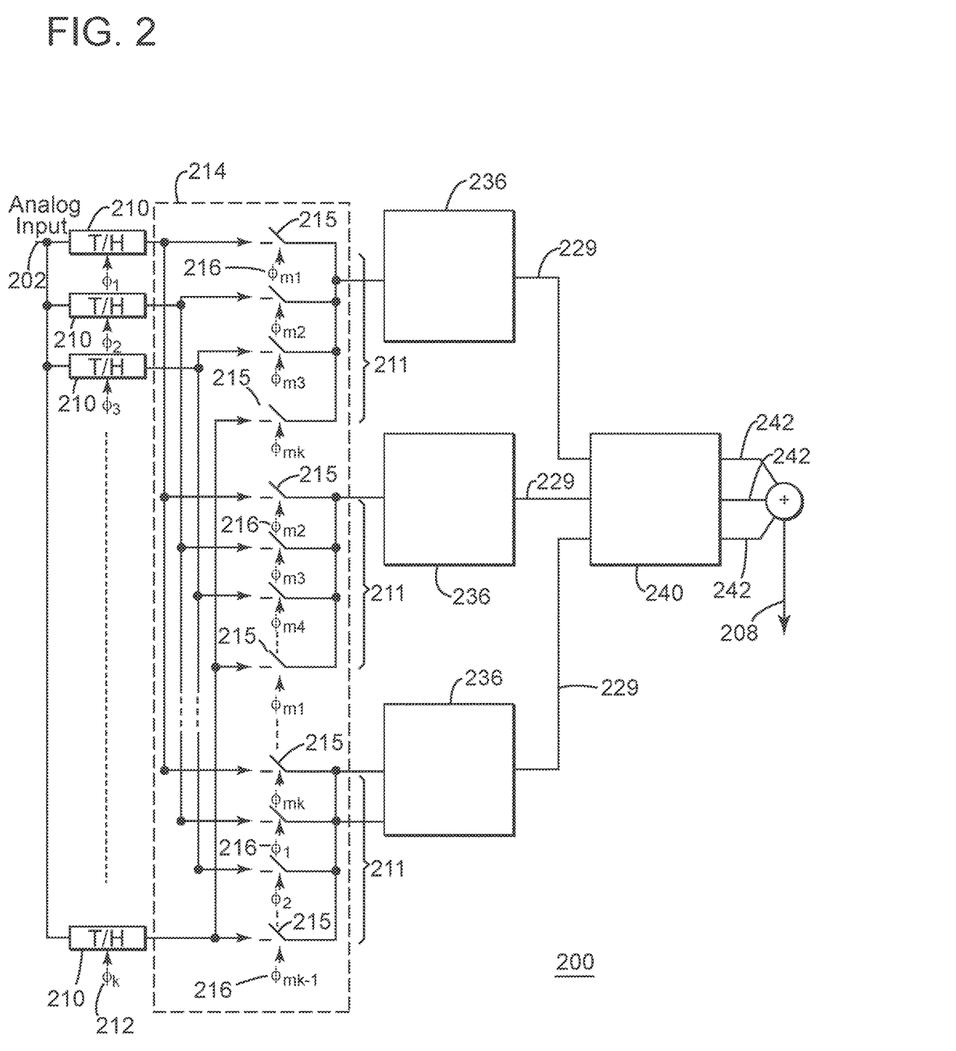
FIG. 2 is a schematic representation illustrating another embodiment of an analog to digital converter in accordance with the present invention.

Referring to FIG. 2, and embodiment of the analog to digital converter 200 having the pipelined architecture is illustrated. The analog to digital converter includes a plurality of track and hold circuits 210. Each track and hold circuit is in communication with the analog voltage input 202 and samples the analog voltage input at a discrete time as provided by the sampling phase signal 212. While the analog voltage input is communicated as a positive input voltage and negative input voltage, for simplicity, it is illustrated as a single analog voltage input. Therefore, each track and hold circuit stores a voltage differential associated with the discrete time at which it sampled the analog voltage input.

As described above, each track and hold circuit is in communication with the multiplexer 214 that distributes the voltage differential from each sampled analog voltage input in series to a plurality of comparator stages 239. Each stage produces a plurality of binary comparator outputs 229 that are communicated to a thermometer to binary converter. The thermometer to binary converter produces a digital stage output 242 for each stage, and the plurality of digital stage outputs are combined into the digital voltage output 208 of the analog to digital converter.

The multiplexer includes a plurality of switches 215. Each switch is in communication with one of the track and hold circuits and a distributing phase signal 216. In addition, each switch is in communication with one of the stages 236 and in particular to each comparator in one of the stages. The switches are arranged in a plurality of groups 211. The number of groups equals the number of stages, and each group of switches is associated with and in communication with one of the stages. In addition, each track and hold circuit is in communication with a single switch in each one of the groups of switches. Therefore, each group of switches includes a switch that is in communication within one of the track and hold circuits. The distributing phase signals are communicated to the switches such that the switches in the groups that are associated with a given track and hold circuit are closed in sequence through the groups of switches to communicate the voltage differential sampled by the given track and hold circuit in sequence through the stages. In addition, the distributing phase signals are activated such that the voltage differential sampled by each track and hold circuit is communicated in the same sequence through the stages. The distributing phase signals are activated so that a unique voltage sample is communicated in parallel to each one of the stages. This produces the pipelined architecture of the analog to digital converter. The analog to digital converter combines this pipelined architecture with digital reference signals that set the reference voltages for each comparator in each stage.

Figure 3:
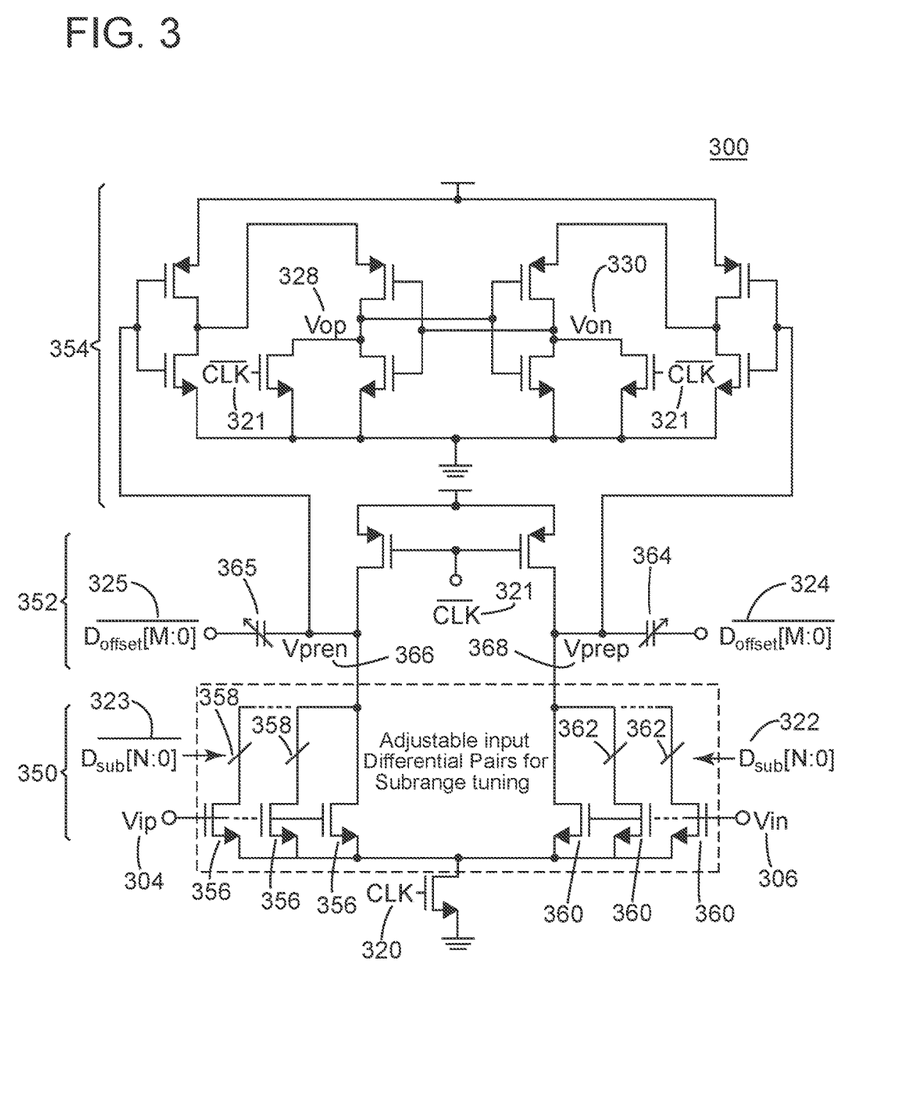
FIG. 3 is a schematic representation illustrating an embodiment of a comparator.

Referring to FIG. 3, an embodiment of a comparator 300 for use in the analog to digital converter is illustrated. The comparator includes a comparator circuitry portion 350, an offset calibration circuitry portion 352 and a latch portion 354. The comparator circuitry portion includes a plurality of positive input voltage transistors 356. Each positive input transistor in communication with the positive input voltage 304, $V_{ip}$, communicated from a track and hold circuit through the multiplexer. Suitable positive input transistors include metal-oxide-semiconductor field-effect transistors (MOSFET). The positive input voltage is in communication with the gate of each positive input transistor. The comparator circuitry portion includes a plurality of negative input voltage transistors 360. Each negative input transistor is in communication with the negative input voltage 306, $V_{in}$, communicated from a track and hold circuit through the multiplexer. Suitable negative input transistors include metal-oxide-semiconductor field-effect transistors (MOSFET). The negative input voltage is in communication with the gate of each negative input transistor.

The comparator circuitry portion also includes a plurality of positive reference voltage selectors 358. Suitable selectors are known and available in the art. Each positive reference voltage selector is in communication with one of the positive input voltage transistors. In one embodiment, each positive reference voltage selector is in communication with the drain of one of the positive input voltage transistors. In one embodiment, at least one drain from one of the positive input voltage transistors is not in communication with one of the selectors and is directly communicated to the calibration circuitry portion of the comparator. The comparator circuitry portion also includes a plurality of negative reference voltage selectors 362. Suitable selectors are known and available in the art. Each negative reference voltage selector is in communication with one of the negative input voltage transistors. In one embodiment, each negative reference voltage selector is in communication with the drain of one of the negative input voltage transistors. In one embodiment, at least one drain from one of the negative input voltage transistors is not in communication with one of the selectors and is directly communicated to the calibration circuitry portion of the comparator.

The plurality of negative reference voltage selectors selects a subset of the plurality of negative input voltage transistors in response to the unique digital reference signal 322, $D_{sub}$ [N:0], that is communicated to the comparator. This includes either the set or dynamic digital reference signal. Selecting the subset of the plurality of negative input voltage transistors adjusts the positive reference voltage 368, $V_{prep}$, within the comparator that is communicated to the calibration circuitry portion of the comparator. Similarly, the plurality of positive reference voltage selectors select a subset of the plurality of positive input voltage transistors in response to an inverse of the unique digital reference signal 323, $\overline{D_{sub}[N:0]}$. Selecting the subset of the plurality of positive input voltage transistors adjusts the negative reference voltage 366, $V_{pren}$, within the comparator that is communicated to the calibration circuitry portion of the comparator. Adjusting the positive reference voltage and the negative reference voltage used generates the binary comparator output, i.e., the positive binary comparator output 328, $V_{op}$, and the negative binary comparator output 330, $V_{on}$, for each comparator indicating a result of a comparison between a voltage differential defined by the positive input voltage and the negative input voltage and a unique voltage range indicated by a unique digital reference signal communicated to each comparator. The positive and negative reference voltages are generated and communicated in response to the clock signal 320 communicated to the comparator.

The offset calibration circuitry portion of the comparator includes a first adjustable capacitor 364 in communication with the digital offset signal 324, $D_{offset}[M:0]$, and the positive reference voltage. The offset calibration circuitry also include a second adjustable capacitor 365 in communication with an inverse of the digital offset signal 325, $\overline{D_{offset}[M:0]}$, and the negative reference voltage. This calibration circuitry adjusts the positive reference voltage and the negative reference voltage in response to the digital offset signal to compensate for differences in threshold values among the plurality of positive input voltage transistors and the plurality of negative input voltage transistors. The latch portion patches the positive and negative reference voltages and produces the positive and negative binary comparator outputs in response to an inverse of the clock signal 320. While embodiments have been illustrated with a complementary metal-oxide semiconductor (CMOS) implementation, embodiments can also include a BiCMOS implementation using bipolar devices for the differential amplifier circuits and latches, and CMOS devices for the switches.

Figure 4:
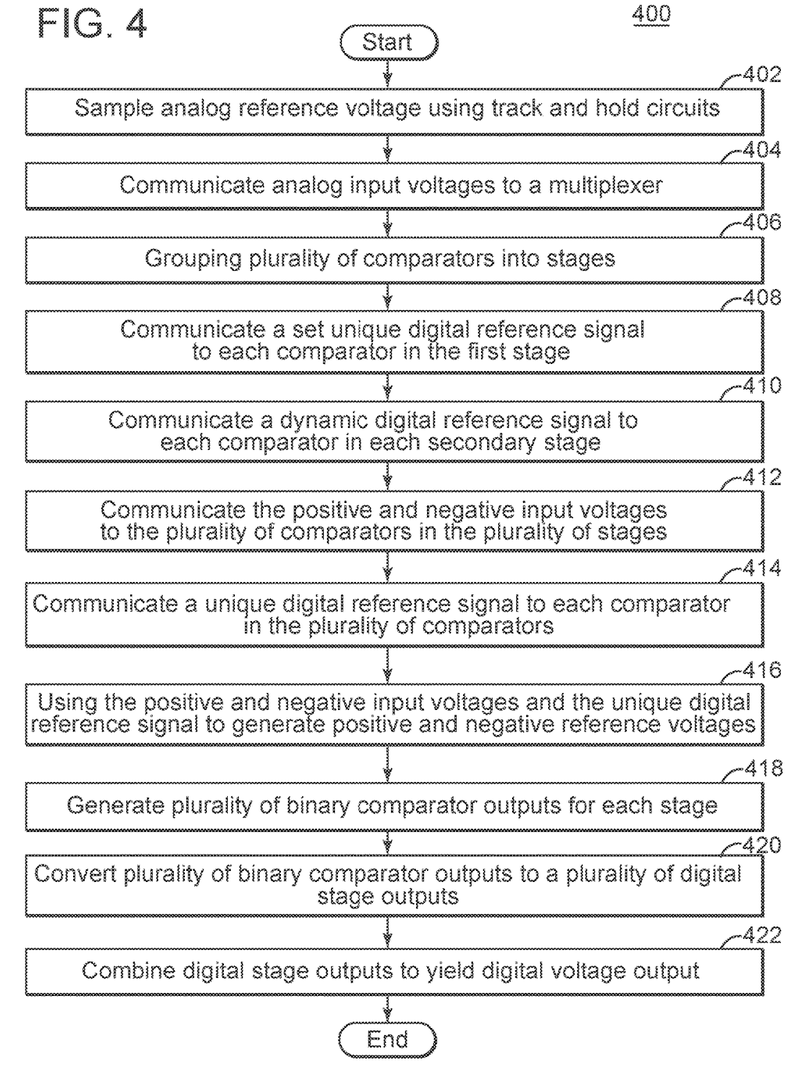
FIG. 4 is a flow chart illustrating an embodiment of a method for converting an analog voltage to a digital voltage in accordance with the present invention.

Referring now to FIG. 4, exemplary embodiments are also directed to a method for converting an analog voltage to a digital voltage 400 utilizing embodiments of the analog to digital voltage converters described herein. An analog input voltage containing a positive input voltage and a negative input voltage is sampled at discrete time periods using a plurality of track and hold circuits 402. The sampled analog input voltages are communicated to a multiplexer 404 containing a plurality of switches that provide a pipelined operational architecture. A plurality of comparators is grouped into at least two stages arranged in series 406. Each stage includes a unique set of comparators from the plurality of comparators. In one embodiment, the at least two stages include a first stage and at least one secondary stage. Each comparator in the first stage is a static comparator, and the method communicates a set unique digital reference signal to each comparator in the first stage 408. The dynamic unique digital reference signal in each secondary stage based on the plurality of binary comparator outputs from a preceding stage. In addition, each comparator in each secondary stage is a dynamic comparator, and the method communicates a dynamic unique digital reference signal to each comparator in each secondary stage 410.

The positive and negative input voltages from the sampled analog reference voltages are communicated to each comparator in each stage 412 using the multiplexer to direct given positive and negative input voltages in series to the stages and in parallel to all comparators in a given stage. In one embodiment, the positive input voltage is communicated to each one of a plurality of positive input voltage transistors in each one of a plurality of comparators, and the negative input voltage is communicated to each one of a plurality of negative input voltage transistors in each one of the plurality of comparators.

A unique digital reference signal is communicated to each one of the plurality of comparators 414. In one embodiment, an inverse of the unique digital reference is communicated to each one of a plurality of positive reference voltage selectors in each comparator and each positive reference voltage selector is in communication with one of the positive input voltage transistors in each comparator. In addition, the unique digital reference signal is communicated to each one of a plurality of negative reference voltage selectors in each comparator, and each negative reference voltage selector is in communication with one of the negative input voltage transistors in each comparator.

The plurality of positive input voltage transistors, the plurality of negative input voltage transistors and the unique digital reference signal to generate a positive reference voltage and a negative reference voltage in each one of the plurality of comparators. In one embodiment, the inverse of the unique digital reference signal to adjust the positive reference voltage in each comparator by selecting a subset of the plurality of positive input voltage transistors in each comparator, and the unique digital reference signal is used to adjust the negative reference voltage in each comparator by selecting a subset of the plurality of negative input voltage transistors in each comparator. A plurality of binary comparator outputs are generated for each stage 418 using the unique set of comparators in each stage. The plurality of comparator outputs are generated by using the positive reference voltage and the negative reference voltage to generate a binary comparator output for each one of the plurality of comparators to indicate a result of a comparison between a voltage differential defined by the positive input voltage and the negative input voltage and a unique voltage range indicated by the unique digital reference signal communicated to each comparator. The plurality of binary comparator outputs for each stage are converted to a digital stage output for each stage 420, and the digital stage outputs for each stage are combined into the digital voltage output 422.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to apparatus (systems) and computer program products according to embodiments of the invention. It will be understood that each description and illustration can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

The schematic illustrations and block diagrams in the Figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

Methods and systems in accordance with exemplary embodiments of the present invention can take the form of an entirely hardware embodiment, an entirely software embodiment or an embodiment containing both hardware and software elements. In a preferred embodiment, the invention is implemented in software, which includes but is not limited to firmware, resident software and microcode. In addition, exemplary methods and systems can take the form of a computer program product accessible from a computer-usable or computer-readable medium providing program code for use by or in connection with a computer, logical processing unit or any instruction execution system. For the purposes of this description, a computer-usable or computer-readable medium can be any apparatus that can contain, store, communicate, propagate, or transport the program for use by or in connection with the instruction execution system, apparatus, or device. Suitable computer-usable or computer readable mediums include, but are not limited to, electronic, magnetic, optical, electromagnetic, infrared, or semiconductor systems (or apparatuses or devices) or propagation mediums. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Suitable data processing systems for storing and/or executing program code include, but are not limited to, at least one processor coupled directly or indirectly to memory elements through a system bus. The memory elements include local memory employed during actual execution of the program code, bulk storage, and cache memories, which provide temporary storage of at least some program code in order to reduce the number of times code must be retrieved from bulk storage during execution. Input/output or I/O devices, including but not limited to keyboards, displays and pointing devices, can be coupled to the system either directly or through intervening I/O controllers. Exemplary embodiments of the methods and systems in accordance with the present invention also include network adapters coupled to the system to enable the data processing system to become coupled to other data processing systems or remote printers or storage devices through intervening private or public networks. Suitable currently available types of network adapters include, but are not limited to, modems, cable modems, DSL modems, Ethernet cards and combinations thereof.

In one embodiment, the present invention is directed to a machine-readable or computer-readable medium containing a machine-executable or computer-executable code that when read by a machine or computer causes the machine or computer to perform a method for converting an analog voltage to a digital voltage in accordance with exemplary embodiments of the present invention and to the computer-executable code itself. The machine-readable or computer-readable code can be any type of code or language capable of being read and executed by the machine or computer and can be expressed in any suitable language or syntax known and available in the art including machine languages, assembler languages, higher level languages, object oriented languages and scripting languages. The computer-executable code can be stored on any suitable storage medium or database, including databases disposed within, in communication with and accessible by computer networks utilized by systems in accordance with the present invention and can be executed on any suitable hardware platform as are known and available in the art including the control systems used to control the presentations of the present invention.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s) and steps or elements from methods in accordance with the present invention can be executed or performed in any suitable order. Therefore, it will be understood that the appended claims are intended to cover all such modifications and embodiments, which would come within the spirit and scope of the present invention.

What is claimed is:

1. An analog to digital converter comprising a plurality of comparators, each comparator comprising:
   a plurality of positive input voltage transistors, each positive input transistor in communication with a positive input voltage; and
   a plurality of negative input voltage transistors in a differential pair configuration with the plurality of positive input voltage transistors, each negative input transistor in communication with a negative input voltage;
   wherein the positive input voltage transistors and negative input voltage transistors in each comparator are configured by a unique digital reference signal communicated to each comparator to adjust a positive reference voltage and a negative reference voltage within each comparator that define a unique voltage range used to generate a binary comparator output for each comparator indicating a result of a comparison between a voltage differential defined by the positive input voltage and the negative input voltage and the unique voltage range.

2. The analog to digital converter of claim 1, wherein the positive input voltage is in communication with a positive input transistor gate of each positive input transistor and the negative input voltage is in communication with a negative input transistor gate of each negative input transistor.

3. The analog to digital converter of claim 1, wherein each comparator further comprises:
   a plurality of positive reference voltage selectors, each positive reference voltage selector in communication with one of the positive input voltage transistors and an inverse of the unique digital reference signal to adjust the positive reference voltage by selecting a subset of the plurality of positive input voltage transistors in response to the inverse of the unique digital reference signal; and
   a plurality of negative reference voltage selectors, each negative reference voltage selector in communication with one of the negative input voltage transistors and the unique digital reference signal to adjust the negative reference voltage by selecting a subset of the plurality of negative input voltage transistors in response to the unique digital reference signal.

4. The analog to digital converter of claim 1, further comprising calibration circuitry that adjusts the positive reference voltage and the negative reference voltage in response to a digital offset signal to compensate for differences in threshold values among the plurality of positive input voltage transistors and the plurality of negative input voltage transistors.

5. The analog to digital converter of claim 1, further comprising at least two stages arranged in a series, each stage comprising a unique set of comparators from the plurality of comparators that generate a plurality of binary comparator outputs associated with that stage, the at least two stages comprising:
   a first stage, each comparator in the first stage comprising a static comparator in communication with a set unique digital reference signal; and
   at least one secondary stage, each comparator in each secondary stage comprising a dynamic comparator in communication with a dynamic unique digital reference signal based on the plurality of binary comparator outputs from a preceding stage in the series.

6. The analog to digital converter of claim 5, wherein:
   the plurality of binary comparator outputs from stage comprise thermometer code;
   the analog to digital converter further comprises a thermometer to binary converter in communication with each stage to convert the thermometer code for each stage to a corresponding digital stage output; and
   the dynamic unique reference signal in each dynamic comparator in each secondary stage is set based on the digital stage output from the preceding stage in the series.

7. The analog to digital converter of claim 6, wherein the thermometer to binary converter further comprises bubble correction.

8. The analog to digital converter of claim 6, wherein a digital voltage output of the analog to digital converter comprises a combination of the digital stage output from all stages.

9. The analog to digital converter of claim 6, further comprising a multiplexer in communication with each one of the plurality of comparators, the multiplexer configured to communicate a given positive input voltage and negative input voltage in parallel to all comparators in a given stage and in series to each stage in the at least two stages.

10. The analog to digital converter of claim 9, further comprising a plurality of track and hold circuits in communication with the multiplexer, each track and hold circuit configured to communicate a separate positive input voltage and negative input voltage to the multiplexer.

11. An analog to digital converter comprising:
   a plurality of comparators grouped into two parallel stages, each stage comprising a unique set of comparators from the plurality of comparators and receiving in series a voltage differential defined by a positive input voltage and a negative input voltage, the two stages comprising:
- a first stage, each comparator in the first stage comprising a static comparator in communication with a set unique digital reference signal and generating a binary comparator output based on a comparison between the set unique digital reference signal and the voltage differential communicated to each comparator in the first stage in parallel to generate a plurality of binary comparator outputs associated with the first stage; and
- a secondary stage, each comparator in each secondary stage comprising a dynamic comparator in communication with a dynamic unique digital reference signal based on the plurality of binary comparator outputs from the first stage to generate the binary comparator output based on a comparison between the dynamic unique digital reference signal and the voltage differential communicated to each comparator in the second stage in parallel.

12. The analog to digital converter of claim 11, wherein:
the plurality of binary comparator outputs from the first stage comprise thermometer code;
the analog to digital converter further comprises a thermometer to binary converter in communication with the plurality of binary comparator outputs to convert the thermometer code for the first stage to a corresponding digital stage output; and
the dynamic unique reference signal in each dynamic comparator in the second stage is set based on the digital stage output from the first stage.

13. The analog to digital converter of claim 11, further comprising a plurality of stages arranged in a series, each stage comprising a unique set of comparators from the plurality of comparators that generate a plurality of binary comparator outputs for that stage, the plurality of stages comprising:
the first stage;
the second stage; and
a plurality of additional secondary stages, each comparator in each secondary stage comprising the dynamic comparator in communication with the dynamic unique digital reference signal based on the plurality of binary comparator outputs from a preceding stage in the series.

14. The analog to digital converter of claim 13, wherein:
the plurality of binary comparator outputs from each stage comprise thermometer code;
the analog to digital converter further comprises a thermometer to binary converter in communication with all binary comparator outputs to convert the thermometer code for each stage to a corresponding digital stage output; and
the dynamic unique reference signal in each dynamic comparator in each secondary stage is set based on the digital stage output from the preceding stage.

15. The analog to digital converter of claim 13, further comprising a multiplexer in communication with each one of the plurality of comparators, the multiplexer configured to communicate a given positive input voltage and negative input voltage in parallel to all comparators in a given stage and in series to each stage in the plurality of stages.

16. The analog to digital converter of claim 14, wherein a digital voltage output of the analog to digital converter comprises a combination of the digital stage output from all stages.

17. The analog to digital converter of claim 11, wherein each comparator further comprises:
a plurality of positive reference voltage selectors, each positive reference voltage selector in communication with one of a plurality of positive input voltage transistors and an inverse of a given unique digital reference signal to adjust a positive reference voltage by selecting a subset of the plurality of positive input voltage transistors in response to the inverse of the given unique digital reference signal; and
a plurality of negative reference voltage selectors, each negative reference voltage selector in communication with one of a plurality of negative input voltage transistors and the given unique digital reference signal to adjust a negative reference voltage by selecting a subset of the plurality of negative input voltage transistors in response to the given unique digital reference signal;
wherein the positive reference voltage and negative reference voltage are used to generate the binary comparator output for each comparator.

18. A method for converting an analog voltage to a digital voltage, the method comprising:
communicating a positive input voltage to each one of a plurality of positive input voltage transistors in each one of a plurality of comparators;
communicating a negative input voltage to each one of a plurality of negative input voltage transistors in each one of the plurality of comparators;
communicating a unique digital reference signal indicating a unique voltage range to each one of the plurality of comparators;
using the unique digital reference signal to configure the plurality of positive input voltage transistors and the plurality of negative input voltage transistors to generate a positive reference voltage and a negative reference voltage in accordance with the unique voltage range in each one of the plurality of comparators; and
using the positive reference voltage and the negative reference voltage to generate a binary comparator output for each one of the plurality of comparators to indicate a result of a comparison between a voltage differential defined by the positive input voltage and the negative input voltage and the unique voltage range.

19. The method of claim 18, wherein:
communicating the unique digital reference signal to each one of the plurality of comparators further comprises:
communicating an inverse of the unique digital reference to each one of a plurality of positive reference voltage selectors in each comparator, each positive reference voltage selector in communication with one of the positive input voltage transistors in each comparator; and
communicating the unique digital reference signal to each one of a plurality of negative reference voltage selectors in each comparator, each negative reference voltage selector in communication with one of the negative input voltage transistors in each comparator;
using the inverse of the unique digital reference signal to adjust the positive reference voltage in each comparator by selecting a subset of the plurality of positive input voltage transistors in each comparator; and
using the unique digital reference signal to adjust the negative reference voltage in each comparator by selecting a subset of the plurality of negative input voltage transistors in each comparator.

20. The method of claim 18, further comprising:
grouping the plurality of comparators into at least two stages arranged in series, each stage comprising a unique set of comparators from the plurality of comparators and the at least two stages comprising:
- a first stage, each comparator in the first stage comprising a static comparator in communication with a set unique digital reference signal; and
- at least one secondary stage, each comparator in each secondary stage comprising a dynamic comparator in communication with a dynamic unique digital reference signal;

using the unique set of comparators in each stage to generate a plurality of binary comparator outputs; and
setting the dynamic unique digital reference signal in each secondary stage based on the plurality of binary comparator outputs from a preceding stage.

* * * * *